US009830247B2

(12) United States Patent
Ivan et al.

(10) Patent No.: US 9,830,247 B2
(45) Date of Patent: Nov. 28, 2017

(54) DIGITAL DEVICE AND METHOD

(71) Applicants: Radu-Marian Ivan, Bucharest (RO);
Razvan Ionescu, Bucharest (RO);
Ionut-Valentin Vicovan, Bucharest (RO)

(72) Inventors: Radu-Marian Ivan, Bucharest (RO);
Razvan Ionescu, Bucharest (RO);
Ionut-Valentin Vicovan, Bucharest (RO)

(73) Assignee: NXP USA, Inc., Austin, TX (US)

( * ) Notice: Subject to any disclaimer, the term of this patent is extended or adjusted under 35 U.S.C. 154(b) by 115 days.

(21) Appl. No.: 14/431,797

(22) PCT Filed: Sep. 27, 2012

(86) PCT No.: PCT/IB2012/055163
§ 371 (c)(1),
(2) Date: Mar. 27, 2015

(87) PCT Pub. No.: WO2014/049396
PCT Pub. Date: Apr. 3, 2014

(65) Prior Publication Data
US 2015/0242300 A1    Aug. 27, 2015

(51) Int. Cl.
*G06F 11/34* (2006.01)
*G01R 31/317* (2006.01)
*G06F 11/30* (2006.01)

(52) U.S. Cl.
CPC .... *G06F 11/3495* (2013.01); *G01R 31/31705* (2013.01); *G06F 11/3065* (2013.01)

(58) Field of Classification Search
CPC ............... G06F 11/323; G06F 11/3466; G06F 11/3495; G06F 11/2294; G06F 11/22;
(Continued)

(56) References Cited

U.S. PATENT DOCUMENTS 5,553,235 A * 9/1996 Chen .................. G06F 11/2294
714/20
6,108,300 A * 8/2000 Coile .................. G06F 11/2005
340/2.9

(Continued)

OTHER PUBLICATIONS

International Search Report and Written Opinion correlating to PCT/IB2012/055163 dated Apr. 26, 2013.
(Continued)

*Primary Examiner* — Nadeem Iqbal

(57) ABSTRACT

A digital device comprising a functional unit, a real-time performance information unit, and a monitoring unit is described. The real-time performance information unit provides real-time performance information about the functional unit. The real-time performance information unit enables the local host device to retrieve the real-time performance information from the real-time performance information unit. The monitoring unit retrieves the real-time performance information from the real-time performance information unit. The monitoring unit has a network interface for connecting to a network. The monitoring unit is arranged to upload the real-time performance information to the network via the network interface. A method of operating the digital device is also described.

19 Claims, 5 Drawing Sheets

(58) Field of Classification Search
CPC ............. G06F 11/2257; G06F 11/3065; G06F 2201/805; G06F 2201/835; G01R 31/31705; G01R 31/31912
See application file for complete search history.

(56) References Cited

U.S. PATENT DOCUMENTS

| | | | |
|---|---|---|---|
| 6,748,558 B1* | 6/2004 | Gonzales | G06F 11/3409 702/182 |
| 7,409,274 B2* | 8/2008 | Grana | G07C 5/008 340/901 |
| 2006/0129346 A1 | 6/2006 | Lee | |
| 2007/0026854 A1 | 2/2007 | Nath et al. | |
| 2007/0038342 A1* | 2/2007 | Grana | G07C 5/008 701/32.6 |
| 2008/0186872 A1 | 8/2008 | Zaencker | |
| 2008/0244239 A1* | 10/2008 | DeWitt | G06F 9/30181 712/220 |
| 2009/0007134 A1 | 1/2009 | Chiu et al. | |
| 2010/0218044 A1 | 8/2010 | Roblett et al. | |
| 2013/0111007 A1* | 5/2013 | Hoffmann | G06F 11/3409 709/224 |

OTHER PUBLICATIONS

Rubio-Loyola, Javier et al: "Accurate Real-Time Monitoring of Bottlenecks and Performance of Packet Trace Collection", Local Computer Networks, 2008, 33rd IEEE Conference, Oct. 14-17, 2008, pp. 884-891.

Olsson, Thomas et al: "An Experiment on Lead-Time Impact in Testing of Distributed Real-Time Systems", Software Metrics Symposium, 2001. METRICS 2001. Proceedings. Seventh International, London, 2001, pp. 159-168.

Tercier, Mary-Lou et al: "A Novel Voltammetric In-Situ Profiling System for ContinuousReal-Time Monitoring of Trace Elements in Natural Waters", Electroanalysis, vol. 10, Issue 6, May 1998, pp. 355-363.

* cited by examiner

DIGITAL DEVICE AND METHOD

FIELD OF THE INVENTION

This invention relates to a digital device and to a method.

BACKGROUND OF THE INVENTION

Digital devices such as microcontrollers, consumer electronic devices, digital signal processors, intelligent switches, or components of such devices often comprise some form of real time monitoring mechanism for enabling a developer to analyze whether the device is operating correctly before the device is released on the market. Such monitoring mechanisms may notably comprise features such as hardware performance counters and one or more hardware trace buffers. Reading out the performance counters or retrieving a trace from a trace buffer usually involves connecting the device to a local host device such as a general purpose computer.

Testing a complex application on a digital device can take many days and may require multiple resources. For instance, in order to test an application which uses a Zigbee communication protocol, two targets, a coordinator, and a node may have to be monitored during the testing phase. Sophisticated hardware and software has, therefore, been developed in recent years in an attempt to automate the testing process where possible.

SUMMARY OF THE INVENTION

The present invention provides a digital device and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
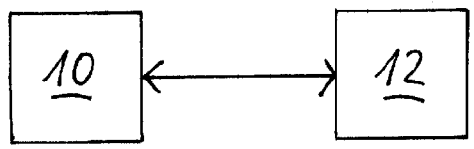
FIG. 1 schematically shows an example of an embodiment of a digital device connected to a local host device.

FIG. 1 schematically shows an example of a digital device 10 connected to a local host device 12 during, e.g., a development phase of the digital device 10. The digital device 10 may, for instance, be a system on chip (SoC) or any other kind of digital device. A SoC is an integrated circuit that unites several functional units on a single chip. A functional unit may, for example, be a processing core, a digital signal processor, a pulse-width modulation unit, or a memory unit. The digital device 10 may also be referred to herein as the target device or target.

The local host device 12 may be a local host of the target device 10. A host of a target is said to be local if the target and host are connected to each other without making use of a network. The target device 10 and the local host device 12 may, for instance, be connected to each other directly by a wired Ethernet connection. The local host device 12 may comprise monitoring software such as an integrated development environment (IDE) for enabling a developer to interact with the target device 10 while the target device 10 is running. Alternatively or additionally, the IDE may collect performance information from the target device 10 while the target device 10 is running and store the collected performance information for later analysis.

Referring now to FIGS. 1 to 7, an example of the digital device 10 is described in greater detail. The digital device 10 may, for example, comprise a functional unit 16, a performance information unit 18, and a monitoring unit 22 (cf. FIG. 3).

The functional unit 16 may be a complex functional unit. It may, for instance, comprise a processor (not shown) for running a program. The functional unit 16 may further comprise, e.g., a program memory unit (not shown) for storing the program. Alternatively or additionally, the functional unit 16 may, for instance, comprise a digital signal processor or any other kind of logical circuitry.

The performance information unit 18 may be connected to or integrated in the functional unit 16 and be arranged to provide performance information about the functional unit 16. This performance information may be real-time information in the sense that it may change in time, e.g., at any clock cycle. The performance information unit 18 may have a host interface 20 for connecting to the local host device 12. The local host device 12 may thus be enabled to retrieve the performance information from the performance information unit 18.

Figure 6:
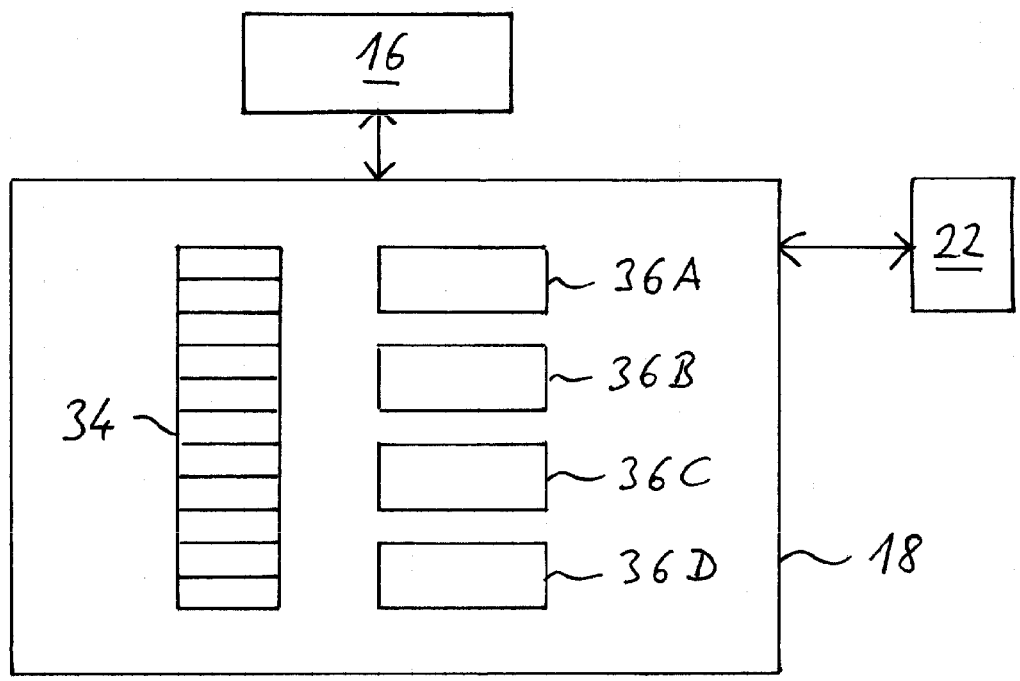
FIG. 6 schematically shows an example of an embodiment of a performance information unit.
Figure 7:
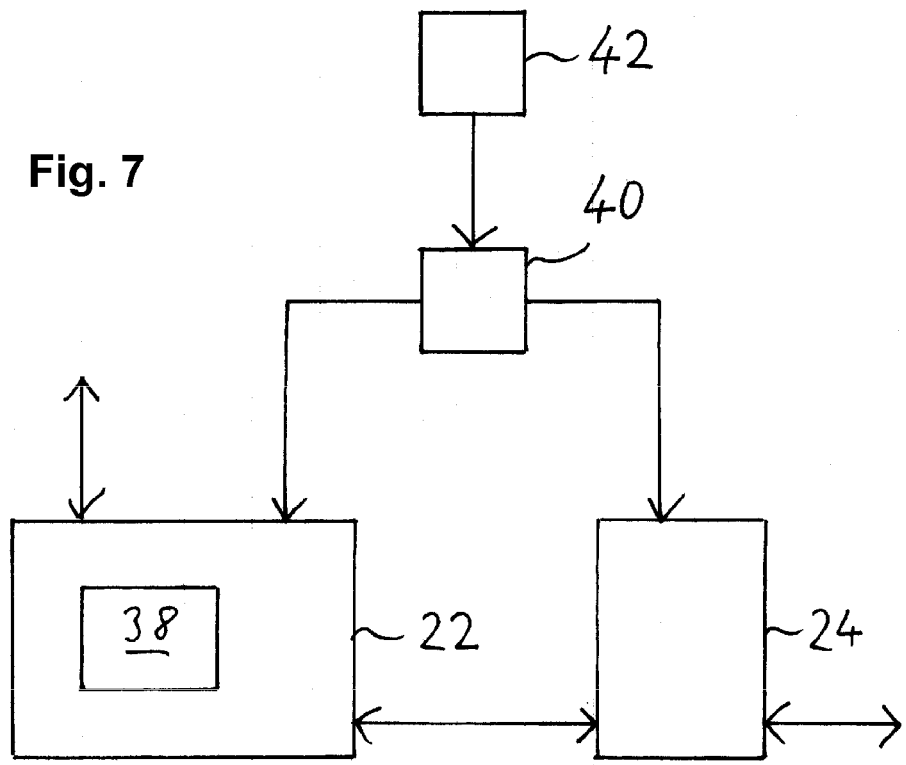
FIG. 7 schematically shows an example of an embodiment of a monitoring unit, a network interface, and a switching unit.

The performance information unit 18 may, for example, comprise a trace buffer 34 (see FIG. 6). The performance information may, in this case, comprise one or more trace items residing in, e.g., the trace buffer 34. A trace may be defined as a sequence of data generated by the functional unit 16 in the course of its operation. New trace items may be appended to the end of the trace. The trace may notably comprise items of information that are specifically provided for monitoring the performance of the functional unit 16. The trace may comprise, for instance, the names or other identifiers of specific blocks of the program code or the current values of variables processed by the functional unit 16. However, the trace may also comprise user data, i.e., payload data or data which is not specifically provided for the purpose of monitoring the functional unit 16.

The performance information unit 18 may further comprise one or more hardware performance counters such as, e.g., hardware performance counters 36A to 36D as shown in FIG. 6. The performance information may, in this case, comprise the respective counts, i.e., the current values, of these hardware performance counters. Each hardware performance counter may, for instance, be arranged to count specific events, for instance, certain interrupts. A hardware performance counter may, for instance, count the clock cycles during which the normal operation of the functional unit 16 was interrupted (interrupt latency) due to the occurrence of interrupts. Alternatively, it may count the number of stalls due to, e.g., memory management unit (MMU) misses or similar events. In another example, a hardware counter may count the number of cache writes and reads.

The monitoring unit 22 may be connected to the performance information unit 18 and be arranged to retrieve the performance information from the performance information unit 18. The monitoring unit 22 may thus provide the digital device 10 with a functionality usually implemented on the host rather than on the target device, namely that of retrieving performance information from the performance information unit 18, e.g., from one or more trace buffers or from one or more hardware performance counters.

Figure 2:
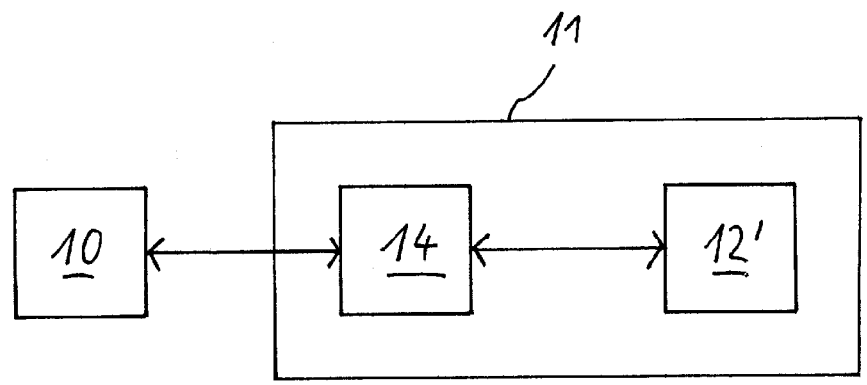
FIG. 2 schematically shows an example of an embodiment of the digital device connected to a distant host device.
Figure 3:
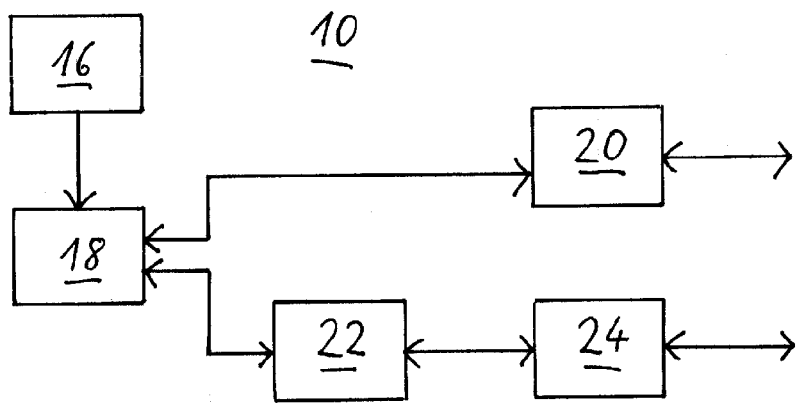
FIG. 3 schematically shows an example of an embodiment of the digital device.

The monitoring unit 22 may have an interface 24 (network interface) for connecting to a network 11 (cf. FIG. 2). A network is a group of information processing devices capable of operating independently and connected to each other via one or more wired or wireless communication links. The communication link between the network interface 24 and the network 11 may be wired, wireless, or a combination thereof. The network 11 may, for example, be the internet. The interface 24 may in this case have an Internet Protocol (IP) address by which it may be addressed by any other device participating in the internet. The network 11 may, for instance, comprise one or more server devices (servers) and one or more client devices (clients) connected to the one or more servers. In the present example, the network 11 comprises, e.g., a server 14 and a distant host device 12' connected to the server 14 as a client of the server 14. The distant host device 12' may, in principle, be the local host device 12 shown in FIG. 1, although in practice, this may rarely be the case because any sufficiently powerful general purpose computer may be arranged to act as a distant host of the target device 10. For example, the local host device 12 may be located at a development or manufacturing centre (not shown) while the distant host device 12' may located at a maintenance centre (not shown). The distant host device 12' may be arranged to interact with the target device 10 via, e.g., the server 14. The network 11 may comprise further devices (not shown) which may participate in the network without affecting the interaction between the distant host device 12' and the target device 10.

The monitoring unit 22 may further be arranged to upload the retrieved performance information to the network 11 via the network interface 24. For example, the monitoring unit 22 may upload the performance information to the server 14 where the performance information may be accessed by any other device participating in the network, e.g., by the distant host device 12', provided that the respective device, e.g., the distant host device 12' is authorized to access the performance information.

The monitoring unit 22 in conjunction with the network interface 24 may notably be used during a use or maintenance phase subsequent to the development phase. The maintenance phase may, for example, start with delivering the digital device 10 to a customer. For instance, the monitoring unit 22 may be arranged to upload performance information from the performance information unit 18 at regular intervals or in response to specific items in that performance information such as an alert message or the value of a specific variable being outside an allowed range.

The monitoring unit 22 may notably comprise a memory unit 38 (see FIG. 7) for storing, e.g., configuration data. The monitoring unit 22 may be arranged to retrieve the performance information from the performance information unit 18 on the basis of this configuration data stored in the memory unit 38. Alternatively or in addition, the monitoring unit 22 may be arranged to control the performance information unit 18 on the basis of the configuration data. The memory unit 38 may be a read-write memory unit. The monitoring unit 22 may, in this case, be arranged to receive new configuration data from the network, e.g., via the server 14, to update the configuration data stored in the memory unit 38 in accordance with the new configuration data. The configuration data may, for instance, specify a certain subset of hardware performance counters, e.g. the counters 36A and 36B, to be monitored by the monitoring unit 22. Alternatively or in addition, the configuration data may, for instance, specify a frequency at which the monitoring unit 22 is to retrieve data from the performance information unit 18. It is noted that the monitoring unit 22 may be arranged to retrieve the performance information from the performance information unit 18 repeatedly; e.g., periodically, that is, repeatedly with a fixed lapse between two successive read out operations.

The digital unit 10 may further comprise a switch unit 40 (see FIG. 7) for enabling a user 42 to activate and deactivate the monitoring unit 22 or the network interface 24 or both. Deactivating the monitoring unit 22 or the network interface 24 may allow to reduce the power consumption of the digital device 10 in a situation in which the user 42 has decided that the real time monitoring function provided by the monitoring unit 22 is not needed for a while. The switch unit 40 may further enable the user 42 to reactivate the monitoring function at any time. Each of the monitoring unit 22 and the network interface 24, or the group consisting of the monitoring unit 22 and the network interface 24 may, for example, comprise one or more power switches (not shown) for powering off these two units 22, 24 individually or as a group. The switch 40 may be arranged to control these one or more power switches.

The digital device 10 may be operated as follows, for example.

Figure 8:
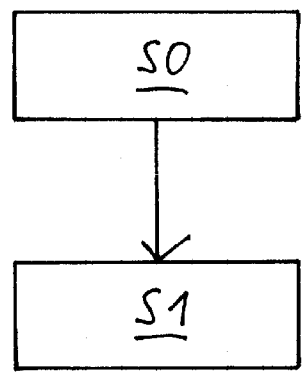
FIG. 8 shows a flow chart of an example of an embodiment of a method of operating a digital device.

In a development phase S1 (see FIG. 8), the performance information unit 18 may be connected to the local host device 12. The local host device 12 may be located near the target device 10, e.g., within a building or within a room of that building. The connection between the local host device 12 and the performance information unit 18 may be a direct one in the sense that it does not rely upon a network. The functional unit 16, the performance information unit 18, and the local host device 12 may be operated simultaneously. The performance information unit 18 may thereby be prompted to provide performance information about the functional unit 16, while the local host device 12 may be prompted to retrieve, i.e. download, the performance information from the performance information unit 18 via the host interface 20.

In a maintenance phase S2, the real time monitoring unit 22 may be connected to the network 11, e.g., to the internet. The network 11 may, for instance, comprise the server 14 and the distant host device 12' as described above. Furthermore, the functional unit 16, the performance information unit 18, the monitoring unit 22, the network interface 24, and the network 11 may be operated simultaneously. The performance information unit 18 may thereby be prompted to provide performance information about the functional unit 16, while the monitoring unit 22 may be prompted to retrieve the performance information from the performance information unit 18 and to upload the performance information to the network 11 via the network interface 24. The monitoring unit 22 may, for instance, upload the real-time performance information to the server device 14. The distant host device 12' may then retrieve the real-time performance information from, e.g., the server 14 and evaluate it.

Figure 4:
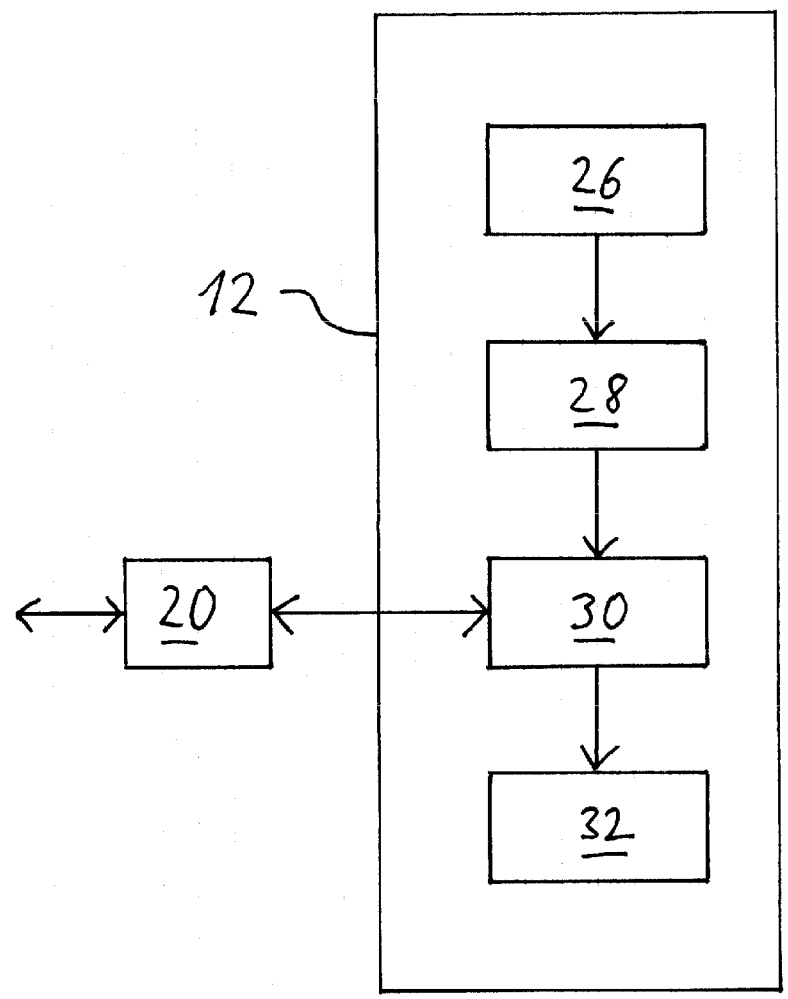
FIG. 4 schematically shows an example of an embodiment of the local host device.

An example of a configuration of the local host device 12 during the development phase S1 is further described in reference to FIG. 4. The local host device 12 may, for example, comprise a user interface 26, an alert triggering unit 28, a target monitoring unit 30, and a notification unit 32. Each of these units 26, 28, 30, and 32 may, for example, be a distinct hardware component of the local host device 12 or, alternatively, be implemented by software residing on the local host device 12. For instance, each of the units 26, 28, 30, and 32 may be provided by a program for being executed by a processor (not shown) of the local host device 12.

The user interface 26 may, for example, be part of an integrated development environment (IDE). The user interface 26 may be arranged to enable a user, e.g., a developer, to interact with the local host device 12. For example, the user interface 26 may be arranged to display information on a screen (not shown) and enable the user to enter input data via input peripherals such as a keyboard, a mouse, a touch pad, or a touch screen. The user interface 26 may notably enable the user to define the new configuration data referred to above.

The alert triggering unit 28 may be arranged to provide, e.g., one or more predefined sets of configuration data. In addition or as an alternative, the alert triggering unit 28 may be arranged to allow for new sets of configuration data. Such new sets may, for instance, be designed by means of the user interface 26. A set of such configuration data may also be referred to herein as an alert configuration. Each alert configuration may, for example, define one or more events which may be detected in the target device 10 and one or more actions to be performed in response to detecting a particular event. An alert configuration may, for instance, define parameters related to, e.g., double data rate (DDR), write and read operations, or more specifically, an interval or a relation between DDR writes and reads, interrupts, trace analysis, and memory corruption. The configuration data may, for instance, be arranged to configure the target monitoring unit 30 to report a number of interrupts on the target device 10, an interrupt latency, stalls due to, e.g., MMU misses or similar events, or cache writes and reads. The interrupt latency may be measured in clock cycles, for example.

As to trace analysis, the alert configuration provided by the alert triggering unit 28 may, for instance, configure the target monitoring unit 30 to look for specific symbols, e.g., program trace items such as interrupt handlers or error handlers, or to look for specific values in, e.g., a data trace, such as invalid memory access, invalid data range, or invalid data values. The alert configuration provided by the alert triggering unit 28 may also configure the target monitoring unit 30 to insert custom messages in the trace. These custom messages may, for example, include status identifiers such as, e.g., one or more Instrumented Trace Macrocell (ITM) messages or one or more Data Acquisition Messages (DQM).

In regard to memory corruption, the alert configuration may, for example, define a memory range within the target device 10 which is to be monitored to detect any illegal access.

Each configuration may be associated with one or more actions to be performed by the target monitoring unit 20. One example of such an action is the sending of an alert which may, for example, incorporate details defined by the alert configuration. Another example of such an action is trace control. Trace control may, for instance, comprise actions such as starting, stopping, or resetting a trace generating unit (not shown) in the real-time performance information unit 18. Another example of trace control may be a feature referred to as "middle trace". This means that if a trace has been started in, e.g., an overwrite mode, another half of the trace buffer may be collected before an alert is sent. This may ensure that the trace data related to the event of interest may be present in the middle of the trace buffer, the trace buffer thus comprising trace items relating to a period preceeding the event and a period following the event. Collecting further trace items after an event of interest may enable the developer to draw additional conclusions about the operation of the target device 10 with regard to the event of interest. Another example includes the control of the hardware performance counters. For example, the alert configuration may configure the target monitoring unit 30 to start, stop, or reset one or more hardware performance counters in response to detecting a certain event on the target device 10.

The target monitoring unit 30 may also be part of the IDE. The target monitoring component 30 may be arranged to configure and to interrogate the target device 10 in accordance with the alert configuration provided by the alert triggering unit 28. The target monitoring unit 30 may thus retrieve the performance information from the target device 10.

The notification unit 32 may be arranged to use processed data to generate reports and to send them to a selected recipient by, e.g., electronic mail or short message service (SMS). The notification unit 32 may, for example, comprise one or more of the following units: a report and alerts generator, a mail notification unit, and a phone application unit. The host comprising the notification unit 32, e.g., the local host device 12, may be connected to a mobile phone (not shown). On the mobile phone, an application may be arranged to wait to receive alerts from the notification unit 32 and to encapsulate these alerts in SMS.

Figure 5:
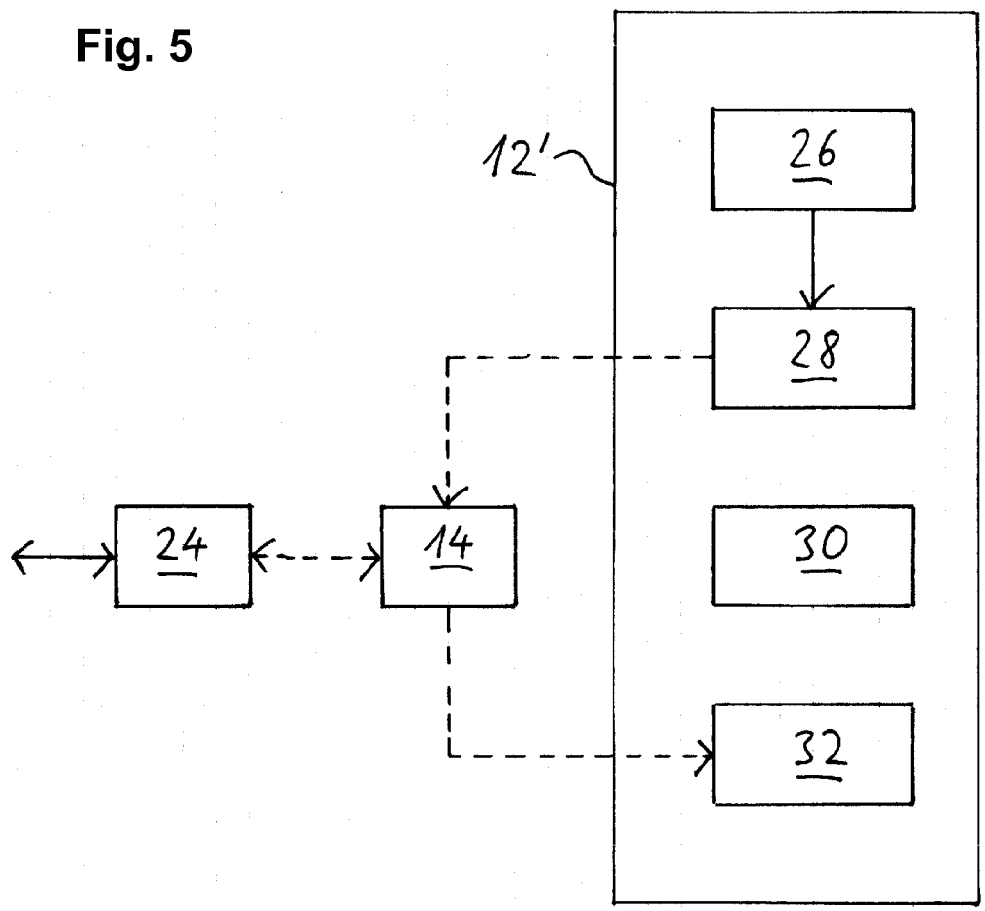
FIG. 5 schematically shows an example of an embodiment of the distant host device.

Referring now to FIG. 5, an example of the maintenance phase S2 is described. In the example shown, the distant host device 12' may be connected to the network interface 24 of the target device 10 via, e.g., the server 14. The server 14 may, for example, be an internet server. The target device 10 or the distant host device 12' or both may be connected to the server 14 via any suitable communication link. The communication link may include a wired or a wireless link or both. A wired link may, for example, include a telephone line.

The user interface 26 of the maintenance phase S2 may, for example, be provided by the server device 14 or by any other server device (not shown) within the network, e.g., within the internet. In the example shown, the user interface 26 may be provided by the distant host device 12'. The user interface 26 of the development phase may thus be a web-based user interface when the network is the internet.

The user interface 26 or components thereof may alternatively be provided by, e.g., the server device 14 in the form of, e.g., a webpage or a website that may be loaded by any authorized host device within the network. A web-based user interface may be particularly easy to access. The web-based user interface 26 may, for example, use a network address of the target device 10 to send, e.g., configuration data to the target device or to interrogate the target device 10. The network address may, for instance, be an internet protocol address (IP address).

The alert triggering unit 28 and the notification unit 32 may be arranged as described above in reference to FIG. 4, i.e., the alert triggering unit 28 and the notification unit 32 may be identical in the development phase S1 and in the maintenance phase S2. The target monitoring unit 30 may be idle or absent in the maintenance phase S2.

In the maintenance phase S2, the monitoring unit 22 on the target device 10 may take over the role played by the target monitoring unit 30 of the local host device 12 during the development phase. The monitoring unit 22 may, for instance, apply the alert configuration received via the network interface 24, e.g., using Ethernet, and may, e.g., periodically read the hardware performance counters, save their current values, and reset the counters to prevent them from overflowing. Depending on the alert configuration, the monitoring unit 22 may send data or alerts or both to the notification unit 30 for further processing.

The local host device 12, the distant host device 12', and the server device 14 may each be, for example, a general purpose computer, such as, for example, a desktop computer, a personal computer (PC), a workstation, a laptop or a notebook.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the monitoring unit 22 and the network interface 24 may be merged in one unit. Similarly, the functional 16 and the performance information unit 18 may be merged in a single unit.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A digital device comprising:
   a real-time performance information unit;
   a functional unit, wherein
      said real-time performance information unit is connected to or integrated in said functional unit and arranged to provide real-time performance information about said functional unit, and said real-time performance information unit has a host interface for connecting said real-time performance information unit to a local host device, thus, during a development phase of the digital device, said local host device enabled to retrieve said real-time performance information from said real-time performance information unit as the said real-time performance information is collected by said real-time performance information unit, wherein the development phase is when the digital device is connected directly to the local host device;
   a monitoring unit, wherein
      said monitoring unit is connected to said real-time performance information unit and arranged to retrieve said real-time performance information from said real-time performance information unit,
      said monitoring unit has a network interface to connect said monitoring unit to a network, and
      said monitoring unit, during a maintenance phase of the digital device subsequent to the development phase, is arranged to upload said real-time performance information to said network via said network interface, wherein the maintenance phase is after the digital device is delivered to a customer; and
   a trace buffer of the real-time performance unit, the trace buffer to store first trace data collected before detection of an event of interest, and second trace data collected after the detection of the event of interest.

2. The digital device of claim 1, wherein said real-time performance information comprises one or more items stored in said trace buffer.

3. The digital device of claim 1, wherein said performance information unit comprises a hardware performance counter and said real-time performance information comprises a count of said hardware performance counter.

4. The digital device of claim 1, wherein said network is the internet.

5. The digital device of claim 4, wherein said network interface has an Internet Protocol address.

6. The digital device of claim 1, wherein said monitoring unit comprises:
   a memory unit for storing configuration data, wherein said monitoring unit is arranged to retrieve said real-time performance information from said real-time performance information unit on the basis of said configuration data stored in said memory unit, or to control said real-time performance information unit on the basis of said configuration data, or both.

7. The digital device of claim 6, wherein said monitoring unit is arranged to receive new configuration data from said network and to update said configuration data stored in said memory unit in accordance with said new configuration data.

8. The digital device of claim 1, wherein said monitoring unit is arranged to perform said retrieval of said performance information from said real-time performance information unit repeatedly.

9. The digital device of claim 1, comprising a switching unit for enabling a user to activate and deactivate said monitoring unit or said network interface or both.

10. The digital device of claim 1, wherein said digital device is a system on chip.

11. A method of operating a digital device; said digital device comprising a functional unit, a real-time performance information unit, and a monitoring unit; wherein said real-time performance information unit is connected to or integrated in said functional unit; wherein said method comprises:
   a development phase of the digital device, the development phase comprising:
      connecting said real-time performance information unit directly to a local host device, and
      simultaneously operating said functional unit, said real-time performance information unit, and said local host device, thereby prompting said real-time performance information unit to provide real-time performance information about said functional unit and prompting said local host device to retrieve said real-time performance information from said real-time performance information unit as the said real-time performance information is collected by said real-time performance information unit;
   a maintenance phase of the digital device subsequent to the development phase, the maintenance phase comprising:
      connecting said real-time monitoring unit to a network, and
      simultaneously operating said functional unit, said real-time performance information unit, said monitoring unit, and said network, thereby prompting said real-time performance information unit to provide real-time performance information about said functional unit and prompting said monitoring unit to retrieve said real-time performance information from said real-time performance information unit and to upload said real-time performance information to said network, wherein the maintenance phase is after the digital device is delivered to a customer; and
   storing, in a trace buffer of the performance information unit, said real-time performance information, wherein the real-time performance information in the trace buffer includes first trace data collected before detection of an event of interest, and second trace data collected after the detection of the event of interest.

12. The method of claim 11, wherein said network comprises a distant host device and said method comprises:
   operating said distant host device to retrieve said real-time performance information from said network and to evaluate said real-time performance information.

13. The method of claim 11, wherein the real-time performance information comprises one or more items stored in said trace buffer.

14. The method of claim 11, further comprising:
   retrieving, by said monitoring unit, said real-time performance information from said real-time performance information unit on the basis of configuration data stored in a memory unit of the monitoring unit.

15. The method of claim 14, further comprising:
   receiving, by said monitoring unit, new configuration data from said network; and
   updating, by said monitoring unit, said configuration data stored in said memory unit in accordance with said new configuration data.

16. The method of claim 11, further comprising:
controlling, by said monitoring unit, said real-time performance information unit on the basis of a configuration data stored in a memory unit of the monitoring unit.

17. The method of claim 11, further comprising:
performing, by said monitoring unit, said retrieval of said performance information from said real-time performance information unit repeatedly.

18. The method of claim 11, further comprising:
enabling, by a switching unit, a user to activate and deactivate said monitoring unit or said network interface or both.

19. The method of claim 11, wherein said performance information unit comprises a hardware performance counter and said real-time performance information comprises a count of said hardware performance counter.

\* \* \* \* \*